US008305200B2

(12) United States Patent
Murphy et al.

(10) Patent No.: US 8,305,200 B2
(45) Date of Patent: Nov. 6, 2012

(54) REACTIVE NETWORKS TO REDUCE ACOUSTIC NOISE AND ENSURE MAXIMUM EFFICIENCIES IN DRIVING PIEZOELECTRIC ELEMENTS IN HAPTIC APPLICATIONS

(75) Inventors: Mark J. Murphy, Kilmore (IE); Alan Gillespie, East Lothian (GB); Eoin Edward English, Pallasgreen (IE); Donal Geraghty, Limerick (IE); Dennis A. Dempsey, Newport (IE)

(73) Assignee: Analog Devices, Inc., Norwood, MA (US)

( * ) Notice: Subject to any disclaimer, the term of this patent is extended or adjusted under 35 U.S.C. 154(b) by 544 days.

(21) Appl. No.: 12/629,629

(22) Filed: Dec. 2, 2009

(65) Prior Publication Data

US 2011/0127880 A1    Jun. 2, 2011

(51) Int. Cl.
  *H04B 3/36* (2006.01)
(52) U.S. Cl. .................. 340/407.1; 340/407.2; 381/71.1; 310/317; 310/318
(58) Field of Classification Search ............... 340/407.1, 340/407.2; 381/71.1; 310/317, 318
See application file for complete search history.

(56) References Cited

U.S. PATENT DOCUMENTS

| 5,684,722 | A | 11/1997 | Thorner et al. |
| 5,923,546 | A | 7/1999 | Shimada et al. |
| 6,134,133 | A | 10/2000 | Noma et al. |
| 6,563,252 | B2 | 5/2003 | Schrod |
| 7,154,470 | B2 | 12/2006 | Tierling |
| 7,233,476 | B2 | 6/2007 | Goldenberg et al. |
| 7,312,554 | B2 * | 12/2007 | Vogeley ........................ 310/317 |
| 7,639,232 | B2 | 12/2009 | Grant et al. |
| 2009/0002328 | A1 | 1/2009 | Ullrich et al. |

FOREIGN PATENT DOCUMENTS

| JP | 2001/309651 | 11/2001 |
| WO | WO2005/065113 | 7/2005 |
| WO | WO 2005065113 A2 * | 7/2005 |

OTHER PUBLICATIONS

Robert Jan Slakhorst, "Switched Mode Piezo-Panel Driver", University of Twente, Faculty of Electrical Engineering, Mathematics, and Computer Science, 2007, pp. 1-134.
U.S. Appl. No. 12/629,662, filed Dec. 2, 2009.
U.S. Appl. No. 12/629,596, filed Dec. 2, 2009.
International Search Report and Written Opinion for PCT/US2010/055932 mailed on Jan. 10, 2011.

* cited by examiner

*Primary Examiner* — Travis Hunnings
(74) *Attorney, Agent, or Firm* — Kenyon & Kenyon LLP

(57) ABSTRACT

A device and method are provided to drive piezoelectric elements in haptic applications. In one embodiment, a pattern generator provides user programmable PWM waveforms to a driver. The load of the driver is an inductor in series with the piezoelectric element. The filtration of the inductor in series with the capacitance of the piezoelectric element suppresses the high-frequency components of the PWM pulse train, and recovers a value commensurate with the duty cycle of the PWM pulse train. The resulting waveform across the piezoelectric element is converted to physical motion, thereby creating a haptic effect on a user interface. Advantageously, there is reduced power loss, reduced switching induced noise, and a more haptic rich environment.

35 Claims, 1 Drawing Sheet

REACTIVE NETWORKS TO REDUCE ACOUSTIC NOISE AND ENSURE MAXIMUM EFFICIENCIES IN DRIVING PIEZOELECTRIC ELEMENTS IN HAPTIC APPLICATIONS

COPYRIGHT AND LEGAL NOTICES

A portion of the disclosure of this patent document contains material that is subject to copyright protection. The copyright owner has no objection to the facsimile reproduction by anyone of the patent document or the patent disclosure, as it appears in the Patent and Trademark Office patent files or records, but otherwise reserves all copyrights whatsoever.

FIELD OF THE INVENTION

The present invention relates generally to piezoelectric elements, and particularly to circuits and methods for driving piezoelectric elements in haptic applications, and haptic-acoustic applications.

BACKGROUND INFORMATION

Piezo materials can be used both as sensors and as actuators. When mechanical stress is applied to a piezo material, an electric charge is produced. Conversely, piezo materials may respond with mechanical motion when subjected to electrical signals. A piezoelectric element may be a block of ceramic material that may be described as a moving capacitor. As the piezoelectric element expands or contracts, its capacitance varies. These flexible properties of piezoelectric elements have made them popular in haptic applications.

Known ways of driving piezoelectric elements suffer from excessive power consumption or switching induced noise, or both. For example, driving a capacitive element with digital patterns may produce large surges in power because power is consumed only during transients and the impedance of the piezoelectric element can be very small on the rising and falling edges of a pulse, thereby resulting in substantial power consumption and switching induced noise. While the movement of some piezoelectric elements is based on inertia principles requiring fast edges, others require drive waveforms which are more sinusoidal in nature. In this resonant approach, a specific frequency of a sinusoidal waveform is applied to induce movement or deformation of the piezoelectric element. Although switching induced noise may not be a problem in the resonant approach, it suffers from substantial power consumption. The power consumption of the piezoelectric element is given in equation 1 below:

$$P = \frac{1}{2}CV^2 f \quad \text{(Eq. 1)}$$

Where:
P=Power Consumed,
C=Capacitance of the Piezoelectric Element,
V=Voltage Applied, and
F=Frequency of Drive Signal.

The circuit used to drive the piezoelectric element also may consume the same amount of power as the piezoelectric element. This is an inherent property of any driver used to drive a piezoelectric or capacitive element directly. Accordingly, the total power consumption is provided in equation 2 below:

$$P = CV^2 f \quad \text{(Eq. 2)}$$

It is therefore a goal of an embodiment of the present invention to provide a device and method to drive piezoelectric elements in haptic applications that do not suffer from substantial power loss, have reduced acoustic and switching induced noise, and provide a more haptic rich environment.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION OF EXAMPLE EMBODIMENTS

Figures 1A, 1B:
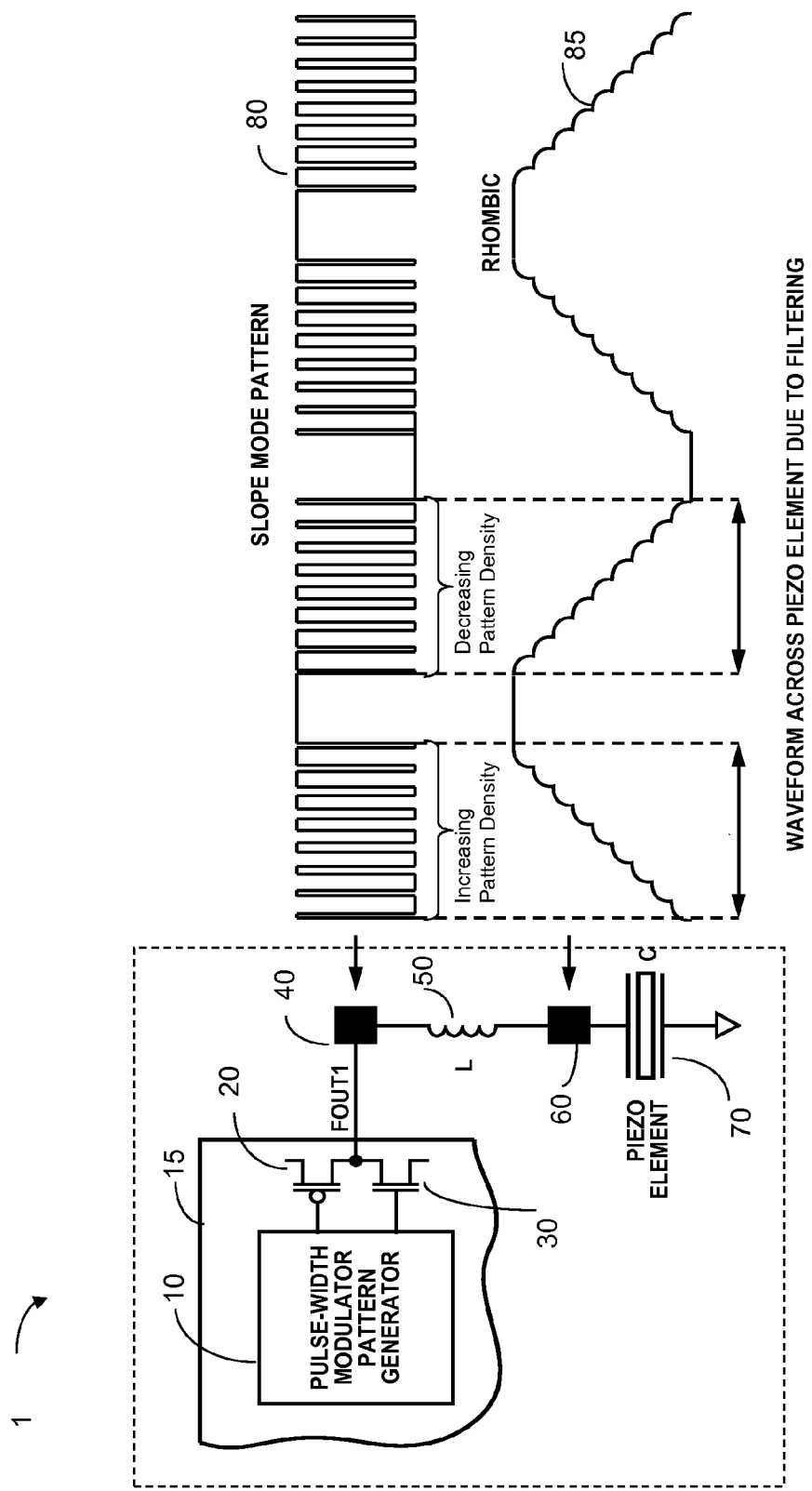
FIG. 1a is shows a circuit in accordance with an embodiment of the present invention.
FIG. 1b shows waveforms of a rhombic drive scheme in accordance with an embodiment of the present invention.

A device and method are provided to drive piezoelectric elements in haptic applications with substantial reduction in power loss, having reduced switching induced noise, and providing a more haptic rich environment.

FIG. 1a is illustrates a circuit in accordance with an embodiment of the present invention. Circuit 1 includes a control module 15 which drives an inductor 50 in series with a piezoelectric element 70. Control module 15 includes a pulse-width modulator 10 coupled to a driver (comprising PMOS 20 and NMOS 30). The pulse-width modulation (PWM) of pulse-width modulator 10 provides an efficient way of delivering power to a load (e.g., L 50 in series with C 70). Pattern generator 10 uses a rectangular pulse train whose pulse width is modulated, resulting in the variation of the average value of the waveform. In this regard, PWM can be used to reduce the total power delivered to a load without losses that would typically be incurred when a power source is limited by resistive means. This is because the average power delivered is proportional to the modulation duty cycle or pattern density. The higher the proportion of the "ON" (high voltage) to "OFF" (low voltage), the higher the pattern density. For example, an "ON" signal at node 40 is provided when pattern generator 10 turns PFET 20 "ON" while turning "OFF" NFET 30. Alternately, an "OFF" signal is provided at node 40 when generator 10 turns PFET 20 "OFF" while turning "ON" NFET 30.

The driver (20, 30) can be operated in several modes, including resonant and PWM, depending on the selection by the user. In one embodiment PFET 20 and NFET 30 comprise a switched output driver. This switched output driver may be a class D output driver. One advantage of a Class D output driver is low power dissipation. In this regard, PFET 20 and NFET 30 are switched either "ON" or "OFF," rather than operated in linear mode, dissipating power only during the short transitions.

Waveform 80 of FIG. 1b illustrates an exemplary PWM Slope Mode pattern at the output 40 of the control module 15. The output 40 of control module 15 is coupled to an inductor 50 in series with a piezoelectric element 70. The inherent low pass filtration of the inductor 50 and piezoelectric element 70 suppresses the high-frequency components of the pulse train, and recovers the average value of the PWM pulse train. Since the average value of the pulses depends on the pulse widths, the signal 60 across the piezoelectric element 70 increases and decreases as the pulse widths increase and decrease, respectively. In this regard, waveform 85 of FIG. 1b illustrates the relation of the signal (at node 60) across piezoelectric element 70 to the increasing pattern density of waveform 80. For example, as the pattern density of waveform 80 at node 40 increases from 10% to 100%, the slope of the waveform 85 at note 60 across piezoelectric element 70 increases with the pattern density. Similarly, as the pattern density of waveform 80 decreases from 100% to 10%, the slope of the waveform 85 across the piezoelectric element 70 decreases. In one embodiment, the user may choose to ramp up signal 60 across piezoelectric element 70 from a low level (GND) to a high level (VDD) in, for example, 1 ms and then ramp down to a low level in, for example, 1 ms.

By controlling the PWM signals of the pattern generator 10, the user is advantageously provided complete control of the slope and the type of signal across the piezoelectric element 70. In one embodiment the signal across the piezoelectric element may be rhombic in shape, as illustrated by waveform 85. Still further, the user may, by increasing the PWM pattern density, decreasing the PWM pattern density, and maintaining a constant pattern density, use a triangular, sinusoidal, saw-tooth, or any other shape to create the desired haptic effect from the piezoelectric element 70. In one embodiment the PWM slope pattern to create specific waveforms across piezoelectric element 70 is programmed in a register. In one embodiment, a default preprogrammed PWM slope pattern may be stored in a register. The user is still afforded complete flexibility by being able to program any pulse train as well as the pattern density. Advantageously, since the user has complete control of the waveform 85 across piezoelectric element 70, the acoustic noise can be minimized. For example, certain human audible ranges may be avoided or cancelled out.

By controlling the rising and falling edges as well as the shape of the waveforms, the user can minimize surges due to transients across the piezoelectric element. Power for the piezoelectric element 70 is ideally only consumed when charging or discharging the capacitance of the piezoelectric element. The power consumption is characterized by equation 3 below. It applies to power consumed when driven directly from a driver output without the presence of an additional inductive component:

$$P = \frac{1}{2}CV^2 f \qquad \text{(Eq. 3)}$$

Where P is the power consumption of the piezoelectric element 70,

C is the capacitance of piezoelectric element 70, and f is the switching frequency of the waveform 85 across the piezoelectric element 70.

In one embodiment, a PWM mode pattern generator 10 driving a piezoelectric element 70 in series with an inductor 50 allows the user to control the rise and fall times as well as the shape of the drive waveform of the piezoelectric element 70 by taking advantage of the energy storage properties of the series inductor as well as the resulting LC filtering of the inductor 50 in series with piezoelectric element 70. Accordingly, instead of using a separate capacitor for the filter, the capacitive behavior of the piezoelectric element 70 can be used as a filtering component.

In one embodiment, the control of the PWM signals of the pattern generator 10 provides the user complete control of the waveform shape across piezoelectric element 70. This allows a rich variety of haptic effects that may be generated by the piezoelectric element 70. In this regard, the magnitude of the effect, duration, as well as the localization of the haptic effect may be controlled. Further, haptic effects may include, for example, vibrations, jolts, the sense of texture, the sense of a user depressing a button, and the like.

In one embodiment, the PWM slope pattern 80 may be applied to the combination of series inductance 50 and capacitance 70, in response to a triggering event. This triggering event may be a tactile input on a user interface comprising at least one sensor. In one embodiment, the user interface is a touch sensitive screen.

In yet another embodiment, the PWM slope pattern of pattern generator 10 is specific to the characteristics of the tactile input determined by the sensor. For example, the magnitude, duration, and direction of the tactile input, provided by the sensor, may be evaluated by the PWM pattern generator 10. In response, the PWM pattern generator 10 may provide a specific PWM pattern. The resulting haptic effect may be commensurate to the tactile input determined by the sensor. For example, the larger the magnitude and duration of the force of the tactile input determined by the sensor, the stronger and longer the force of the haptic response. In one embodiment, the haptic response is on the same user interface where the tactile input of the triggering event occurred. In this regard, the pattern generator 10 provides specific PWM patterns, to generate the required waveform across a piezoelectric element 70, thereby creating haptic physical sensations to the user manipulating the user interface. Indeed, the haptic response may be at substantially the same coordinates as the tactile input. Alternatively, the haptic response may provide the sensation to the user that the haptic output is at the same coordinates as the tactile input. In accordance with an embodiment of the present invention, the delay between the triggering event and the response of the actuator driver is not noticeable to the user. Thus, the user is advantageously provided a substantially simultaneous haptic response to his tactile input.

In one embodiment, the touch sensitive screen includes at least one piezoelectric element used as the sensor for the tactile input. This piezoelectric element may be separate from the piezoelectric element 70 of circuit 1. Alternatively, in another embodiment, given the dual nature of piezoelectric devices, the piezoelectric element of the sensor may be the same as the piezoelectric element 70 of the actuator of circuit 1.

In yet another embodiment, an even more haptic rich environment may be provided by the user interface having a plurality of piezoelectric elements 70. Accordingly, each piezoelectric element 70 may have a control module 15 and a series inductance 50, respectively. For example, in one embodiment, the user interface may be a touch sensitive screen including four piezoelectric elements, for example one piezoelectric element in each of four quadrants of the touch sensitive screen. For example, there may be one piezoelectric element in each of four quadrants of the touch sensitive screen. The control modules of each of the four piezoelectric elements may act concurrently to provide the desired haptic effect through the user interface. Similarly, in one embodiment, the number of piezoelectric elements may be as few as one or as many as the number of simulated buttons or keys on the touch sensitive screen.

Still further, the user interface may be treated as a membrane whose movement, i.e., vibration, is controlled by the piezoelectric elements. Since an object produces sound when it vibrates in air, the piezoelectric elements of the foregoing discussion can be used to create sound. In one embodiment, control module 15 may provide PWM signals to the piezoelectric element 70 through the series inductor to use the user interface as a speaker, for example.

While the invention has been described in terms of particular embodiments, it will be obvious to those skilled in the art that, based upon the teachings herein, changes and modifications may be made without departing from the invention. For example, many different types of PWM shapes may be provided by the pattern generator, and hence different haptic sensations can be provided with the actuator. The present invention as claimed, therefore, includes variations from the specific examples and embodiments described herein, as will be apparent to one of skill in the art. Accordingly, it is intended that the invention be limited only in terms of the appended claims.

What is claimed is:

1. An actuator for a haptic device, comprising:
    a control module, including:
        a pulse-width modulator (PWM) pattern generator, and
        a driver coupled to an output of the pattern generator,
    an inductor coupled to an output of the driver, and
    a piezoelectric element in series with the inductor, wherein the pattern generator provides programmable PWM waveforms to control a movement of the piezoelectric element, thereby providing a desired haptic effect.

2. The actuator of claim 1, wherein the driver is a switched output driver.

3. The actuator of claim 1, wherein an inherent low pass filtration of the inductor and a capacitance of the piezoelectric element suppresses high frequency components of the PWM waveforms and recovers an average value of the PWM waveforms, thereby smoothing a waveform across the piezoelectric element.

4. The actuator of claim 1, wherein a waveform across the piezoelectric element is
    ramped from a low level to a high level in 1 ms,
    ramped from a high level to a low level in 1 ms, and
    rhombic in shape.

5. The actuator of claim 1, wherein a default PWM pattern is stored in a register.

6. The actuator of claim 1, wherein the movement of the piezoelectric element controls a magnitude, a duration, and the localization of the haptic effect.

7. The actuator of claim 1, wherein the haptic effect includes at least one of a vibration, a jolt, a sense of texture, or a sense of a user depressing a button.

8. The actuator of claim 1, wherein the pattern generator provides the PWM waveforms in response to a triggering event.

9. The actuator of claim 8, wherein the triggering event is a tactile input on a user interface having at least one sensor.

10. The actuator of claim 9, wherein
    the user interface is a touch sensitive screen, and
    the at least one sensor is a piezoelectric sensor.

11. The actuator of claim 10, wherein the at least one piezoelectric sensor is the piezoelectric element in series with the inductor.

12. The actuator of claim 9, wherein
    at least one of a magnitude, a duration, and a direction of the tactile input sensed by the at least one sensor is analyzed by the pattern generator, and
    the pattern generator generates PWM waveforms based on the analysis.

13. The actuator of claim 10, wherein the larger the magnitude and duration of a force of the tactile input sensed by the at least one sensor, the stronger and longer the force of the haptic effect.

14. The actuator of claim 10, wherein the haptic effect is on the same user interface where the triggering event occurred.

15. The actuator of claim 10, wherein the haptic effect is at substantially the same coordinates and time as the tactile input.

16. The actuator of claim 10, wherein the control module provides PWM signals to control the user interface as a speaker.

17. A method of driving a piezoelectric element, comprising:
    a pattern generator providing user programmable PWM waveforms to a driver,
    the driver driving the PWM waveforms to an inductor in series with a piezoelectric element, and
    converting a waveform signal across the piezoelectric element into a physical motion, wherein the physical motion creates a haptic effect.

18. The method of claim 17, further comprising:
    suppressing high frequency components of the PWM waveforms by an inherent low pass filtration of the inductor and a capacitance of the piezoelectric element, and
    recovering an average value of the PWM waveforms by the inherent low pass filtration.

19. The method of claim 17, wherein the waveform signal across the piezoelectric element is
    ramped from a low level to a high level in 1 ms,
    ramped from a high level to a low level in 1 ms, and
    rhombic in shape.

20. The method of claim 17, further comprising:
    storing a default PWM pattern in a register.

21. The method of claim 17, further comprising:
    controlling a magnitude, a duration, and the localization of the haptic effect, through the physical motion of the piezoelectric element.

22. The method of claim 21, wherein the haptic effect includes at least one of a vibration, a jolt, a sense of texture, or a sense of a user depressing a button.

23. The method of claim 17, further comprising:
    the pattern generator providing the PWM waveforms in response to a triggering event.

24. The method of claim 23, wherein the triggering event is a tactile input on a user interface having at least one sensor.

25. The method of claim 24, wherein
    the user interface is a touch sensitive screen, and
    the at least one sensor is a piezoelectric sensor.

26. The method of claim 25, wherein the at least one piezoelectric sensor is the piezoelectric element in series with the inductor.

27. The method of claim 24, further comprising:
    the at least one sensor providing at least one of a magnitude, a duration, and a direction information of the tactile input,
    the pattern generator analyzing the sensor information, and
    the pattern generator generating PWM waveforms based on the analysis.

28. The method of claim 27, wherein the larger the magnitude and duration of a force of the tactile input provided by the at least one sensor, the stronger and longer the force of the haptic effect.

29. The method of claim 24, wherein the haptic effect is on the same user interface where the triggering event occurred.

30. The method of claim 28, wherein the haptic effect is at substantially the same coordinates and time as the tactile input.

31. The method of claim 25, wherein the control module provides PWM signals to control the user interface as a speaker.

32. The method of claim 17, wherein the driver is a switched output driver.

33. A user interface for a haptic device comprising a plurality of actuators, each actuator including:
   a control module, including:
      a pulse-width modulator (PWM) pattern generator, and
      a driver coupled to an output of the pattern generator,
   an inductor coupled to an output of the driver, and
   a piezoelectric element in series with the inductor,
   wherein the pattern generator of each actuator provides programmable PWM waveforms to control a movement of each piezoelectric element respectively,
   wherein the pattern generator of each actuator provides the PWM waveforms in response to a triggering event,
   wherein the triggering event is a tactile input on the user interface, and
   wherein a haptic effect is created at substantially the same coordinates and the same time as the tactile input.

34. The user interface of claim 33, wherein the number of actuators is four.

35. The user interface of claim 33, wherein there is one actuator for each simulated key.

* * * * *